(12) United States Patent
Wayman

(10) Patent No.: US 7,652,880 B2
(45) Date of Patent: Jan. 26, 2010

(54) COMBINED-NATURAL-AND-FORCED-CONVECTION HEAT SINK

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 344 days.

(21) Appl. No.: 11/692,000

(22) Filed: Mar. 27, 2007

(65) Prior Publication Data

US 2008/0239669 A1 Oct. 2, 2008

(51) Int. Cl.
*H05K 7/20* (2006.01)

(52) U.S. Cl. .................. 361/690; 361/695; 361/697; 361/704; 361/679.48; 361/679.49; 165/80.3; 165/122

(58) Field of Classification Search ......... 361/690–697, 361/702–712, 717–722; 165/80.2, 80.3, 165/104.33, 104.34, 104.21, 122, 185; 174/15.1, 174/16.1, 16.3, 252; 257/706–727
See application file for complete search history.

(56) References Cited

U.S. PATENT DOCUMENTS

| 5,028,989 | A | | 7/1991 | Naganuma et al. |
| 5,251,099 | A | | 10/1993 | Goss et al. |
| 5,262,587 | A | | 11/1993 | Moser |
| 5,526,289 | A | * | 6/1996 | Dinh et al. ................ 700/300 |
| 6,351,382 | B1 | * | 2/2002 | Nakanishi et al. .......... 361/700 |
| 6,621,700 | B1 | * | 9/2003 | Roman et al. ............... 361/697 |
| 7,391,614 | B2 | * | 6/2008 | Artman ..................... 361/704 |
| 7,466,551 | B2 | * | 12/2008 | Artman ..................... 361/704 |
| 7,509,996 | B2 | * | 3/2009 | Peng ......................... 165/80.3 |
| 2005/0098300 | A1 | | 5/2005 | Kawabata et al. |
| 2007/0247809 | A1 | | 10/2007 | McClure |

FOREIGN PATENT DOCUMENTS

| JP | 02005114341 A | * | 4/2005 |
| KR | 2001099127 A | * | 11/2001 |

* cited by examiner

*Primary Examiner*—Michael V Datskovskiy
(74) *Attorney, Agent, or Firm*—Fogg & Powers LLC

(57) ABSTRACT

A combined-natural-and-forced-convection heat sink system including a plurality of fins protruding from a first surface of a conductive material, a plurality of air channels formed between the first surface and an opposing second surface of the conductive material and at least one fan. The plurality of fins forms a natural-convection heat sink. The plurality of air channels forms a forced-convection heat sink. The natural-convection heat sink and the forced-convection heat sink form a combined-natural-and-forced-convection heat sink. Each air channel has an input end opening on an input surface of the conductive material and each air channel has an output end opening on an output surface of the conductive material. The at least one fan is configured to generate an air flow through the air channels when at least one of the fans is operating.

12 Claims, 13 Drawing Sheets

Fig.1i

COMBINED-NATURAL-AND-FORCED-CONVECTION HEAT SINK

CROSS REFERENCE TO RELATED APPLICATIONS

This application is related to U.S. patent application Ser. No. 11/692,026 having a title of "MODULARIZED RF BAND COMPONENTS ON REMOVABLE DOORS" (also referred to here as the "100.840 Application"), and U.S. patent application Ser. No. 11/691,970 having a title of "APPARATUS FOR TRANSFERRING HEAT BETWEEN TWO CORNER SURFACES" (also referred to here as the "100.832 Application") filed on the same date herewith. The 100.840 Application and the 100.832 Application are hereby incorporated herein by reference.

BACKGROUND

Outdoor enclosures that contain high-power electronic components require a method to dissipate the heat generated by the electronic components. At the same time, it is often required that the electronic components be enclosed in a sealed enclosure to protect the electronic components from the outside environment. Typically, the high power components are attached to a heat sink. The heat from the electronic components travels through the heat sink and the outer surface area creates a natural convection via the heat sink fins to dissipate the heat.

In some cases, the high-power electronic components dissipate too much heat for natural conduction to remove all the heat at all times. In this case, fans and a fan shroud can be employed to cover the entire outer surface of the heat sink and drive forced air between the fins to increase the volumetric air flow, thus increasing the cooling capacity of the heat sink. The fan shroud cover is necessary to keep the forced air between the fins, but limits the fins ability to cool via natural convection if the ambient temperatures are low enough. This solution requires the fans to run at all times, even when the ambient conditions are cool enough for an un-shrouded heat sink to be capable of cooling the electronic components without a fan. The continuous use of the fans is power consuming. Continuously-used fans need repair or replacement more often than intermittently-used fans. The running fans also generate audible noise. To some extent, the shroud that is required to keep the fan-forced air against the outer surface of the heat sink acts as a barrier to natural convection.

SUMMARY

In one embodiment, a combined-natural-and-forced-convection heat sink system includes a plurality of fins protruding from a first surface of a conductive material, a plurality of air channels formed between the first surface and an opposing second surface of the conductive material and at least one fan. The plurality of fins forms a natural-convection heat sink. The plurality of air channels forms a forced-convection heat sink. The natural-convection heat sink and the forced-convection heat sink form a combined-natural-and-forced-convection heat sink. Each air channel has an input end opening on an input surface of the conductive material and each air channel has an output end opening on an output surface of the conductive material. The at least one fan is configured to generate an air flow through the air channels when at least one of the fans is operating.

In a second embodiment, a method of removing heat from electronic components in a housing comprises using a natural-convection heat sink of a combined-natural-and-forced-convection heat sink to remove heat from the electronic components in the housing, monitoring the temperature inside the housing, turning on at least one fan positioned adjacent to the housing when the temperature inside the housing exceeds a temperature threshold to generate an airflow and using a forced-convection heat sink and the natural-convection heat sink of the combined-natural-and-forced-convection heat sink to remove heat from the components in the housing responsive to turning on the at least one fan.

In a third embodiment, a method of using a combined-natural-and-forced-convection heat sink comprises attaching electronic components to a substantially flat surface of the combined-natural-and-forced-convection heat sink comprising a natural-convection heat sink and a forced-convection heat sink, attaching a portion of the substantially flat surface to a rim surface of a housing, wherein the electronic components are enclosed in the housing, attaching an open heat-sink-interface end of a fan shroud to the housing so the open heat-sink-interface end is operably positioned adjacent to the input surface of the conductive material, and inserting at least one fan into an open fan end of the fan shroud.

DRAWINGS

FIG. 1 is a sketch of one embodiment of a combined-natural-and-forced-convection heat sink.

FIG. 1*i* is an enlarged view of an input end of an air channel in a forced convection heat sink of FIG. 1.

Figure 6:
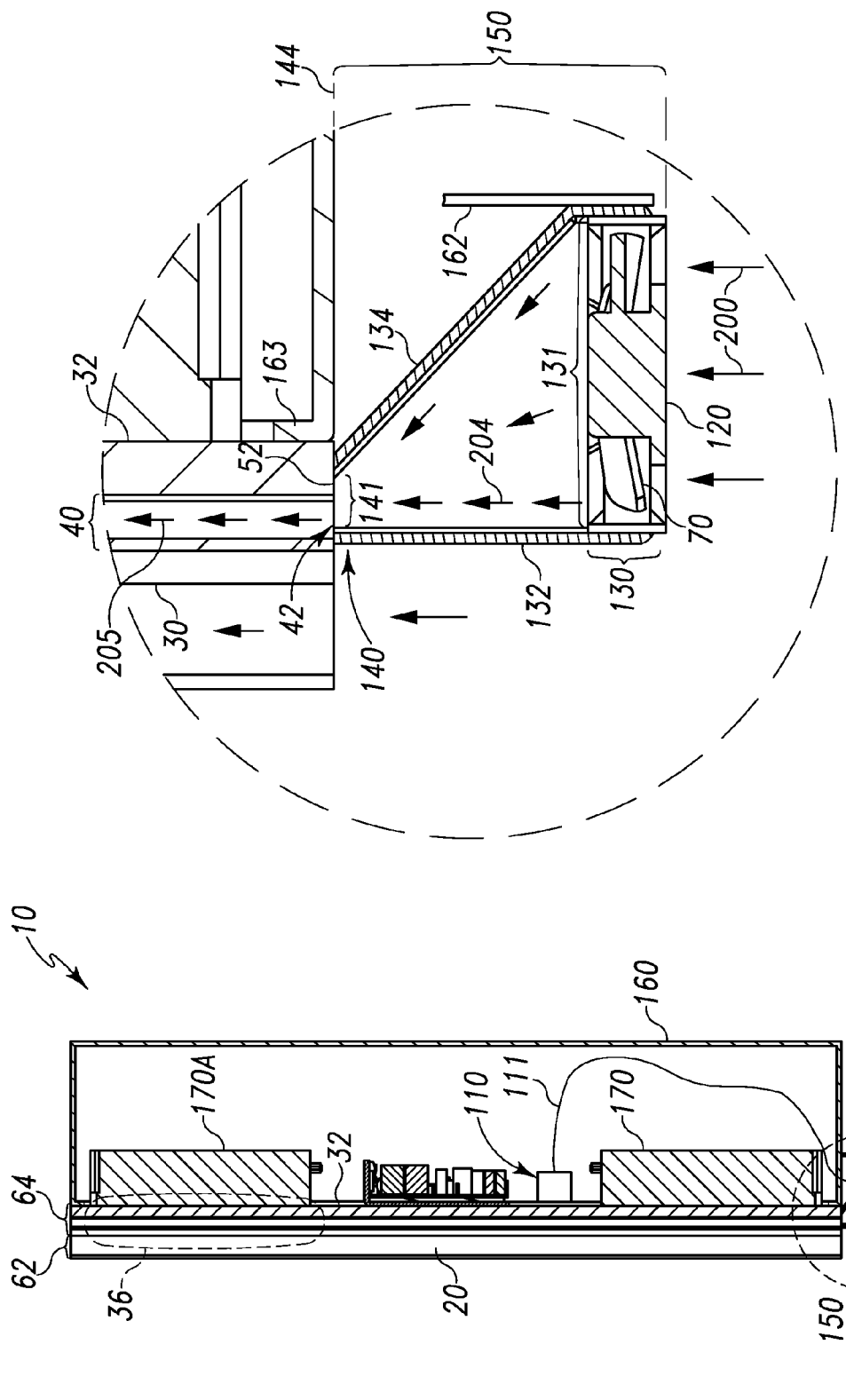
FIG. 6 is a view of one embodiment of a combined-natural-and-forced-convection heat sink system with attached electronic components enclosed in a housing.

FIG. 6*i* is an enlarged view of the fan shroud operably positioned to direct air flow into the forced convection channels to remove heat from the combined-natural-and-forced-convection heat sink of FIG. 6.

Figure 7:
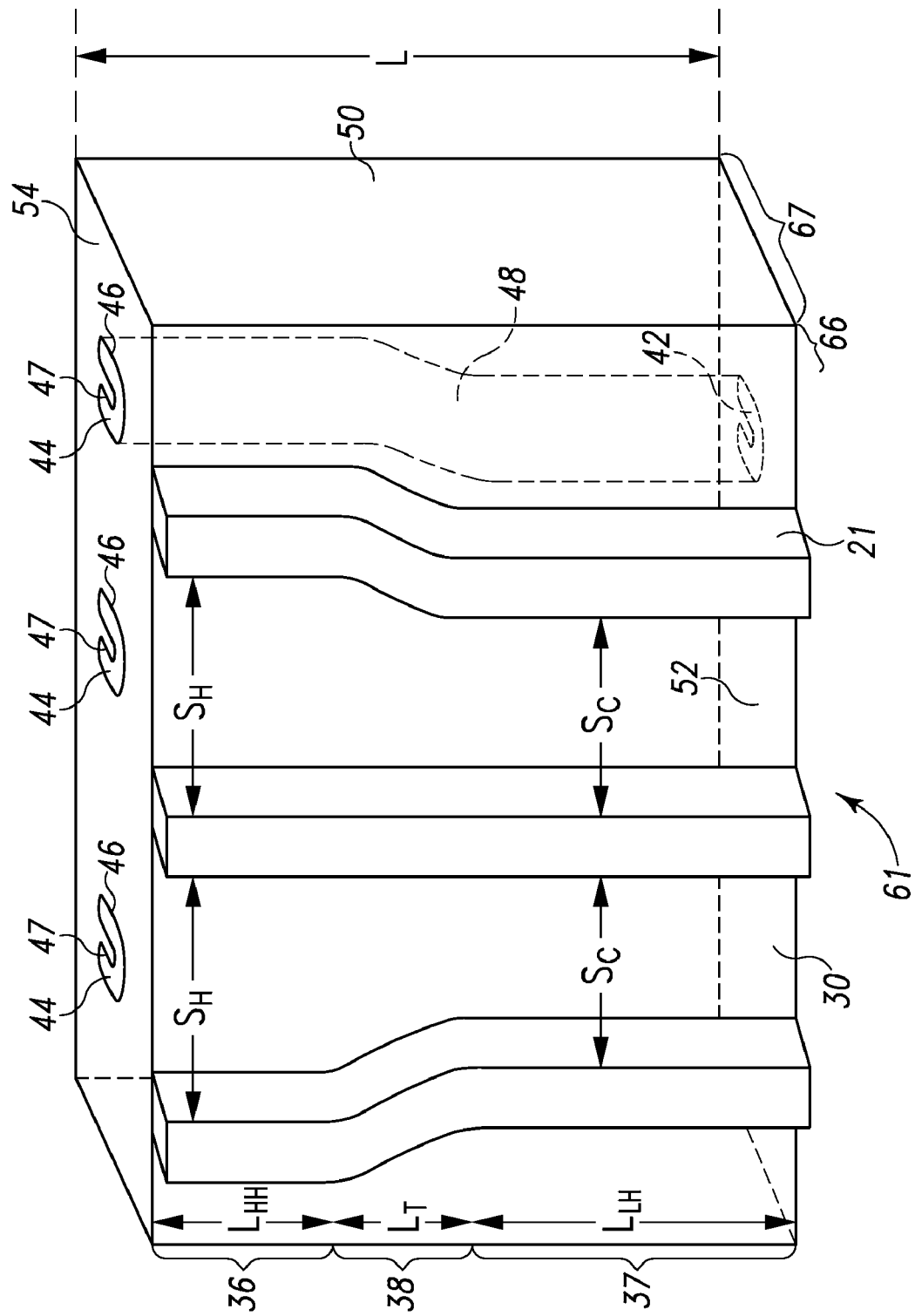

FIG. 7 is an exemplary configuration of combined-natural-and-forced-convection heat sink in which the spacing between the fins and the air-channel fins increases when the fins and the air-channel fins are adjacent to the higher-heat region.

Figure 8:
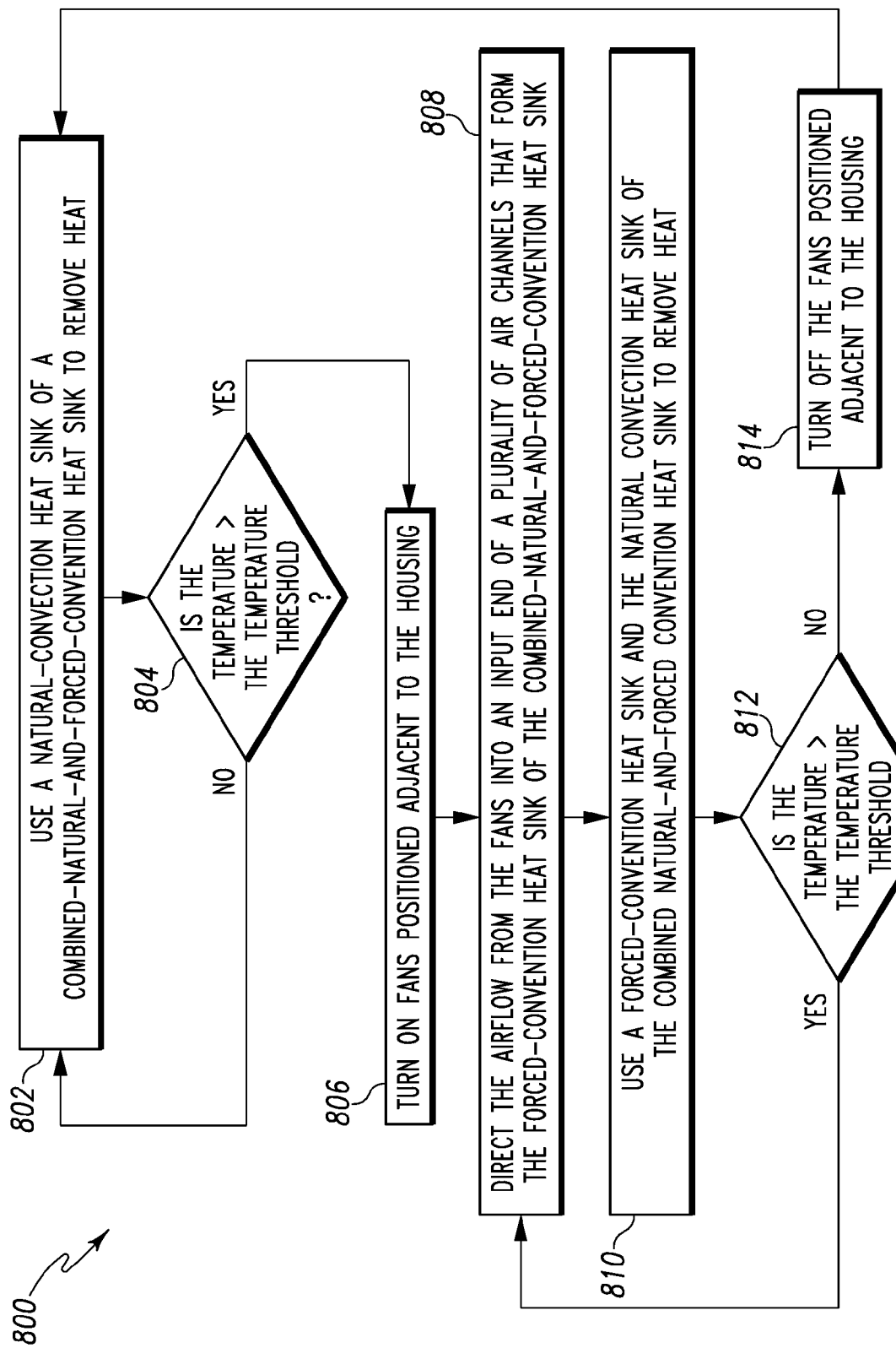

FIG. 8 is a flow diagram of one embodiment of a method to remove heat from electronic components positioned in a housing.

Figure 9:
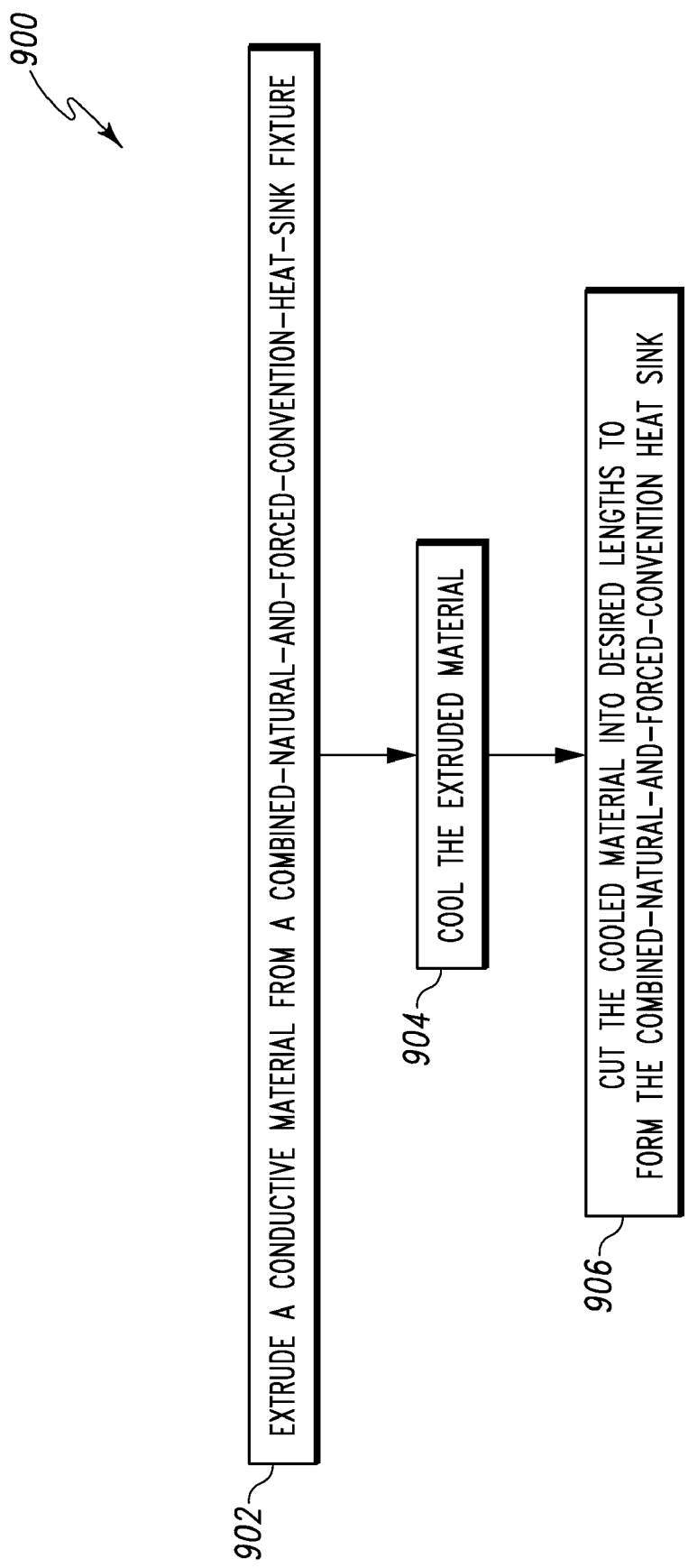

FIG. 9 is a flow diagram of one embodiment of a method to make a combined-natural-and-forced-convection heat sink.

Figure 10:
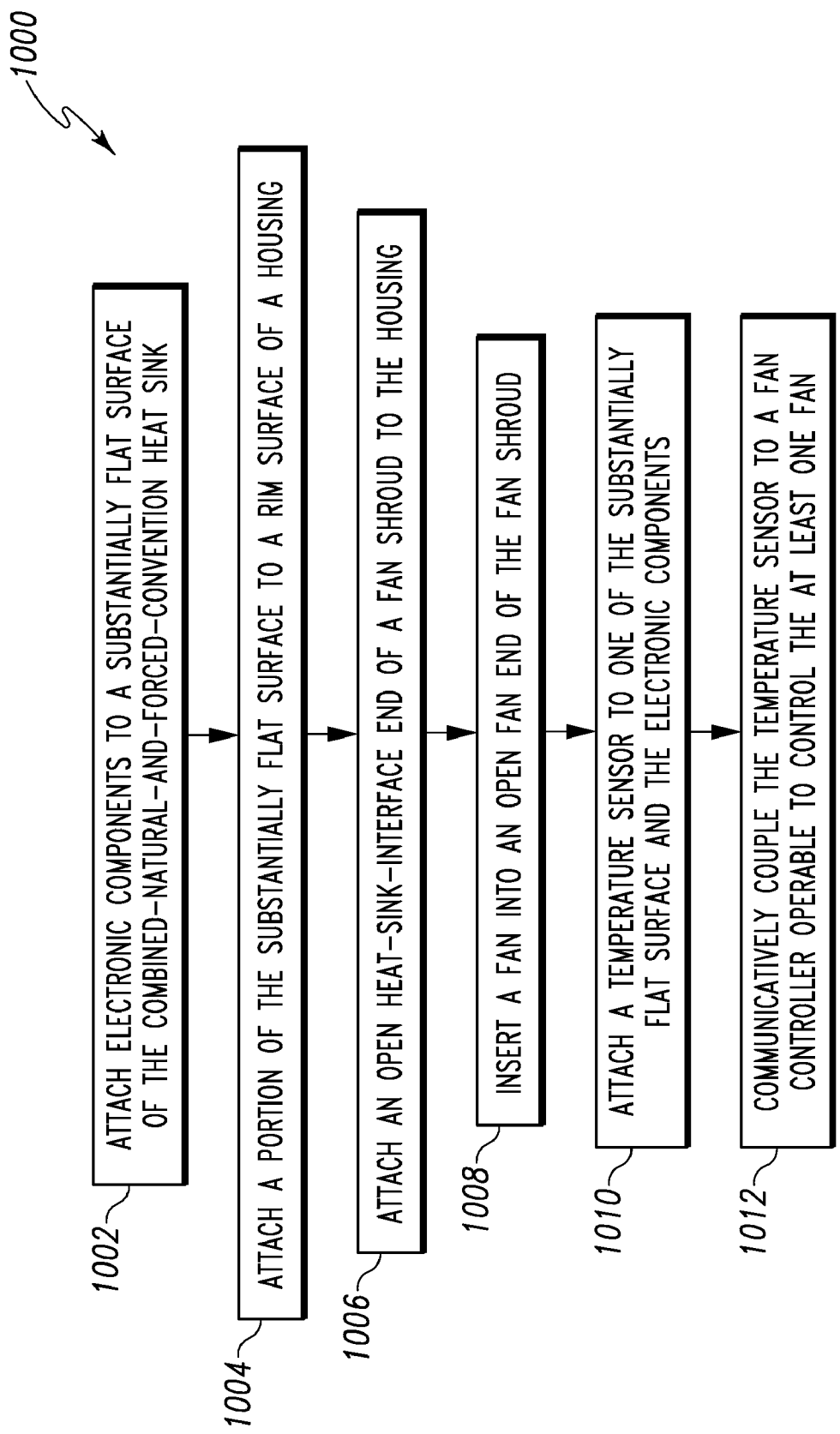

FIG. 10 is a flow diagram of one embodiment of a method to use a combined-natural-and-forced-convection heat sink.

Figure 11:
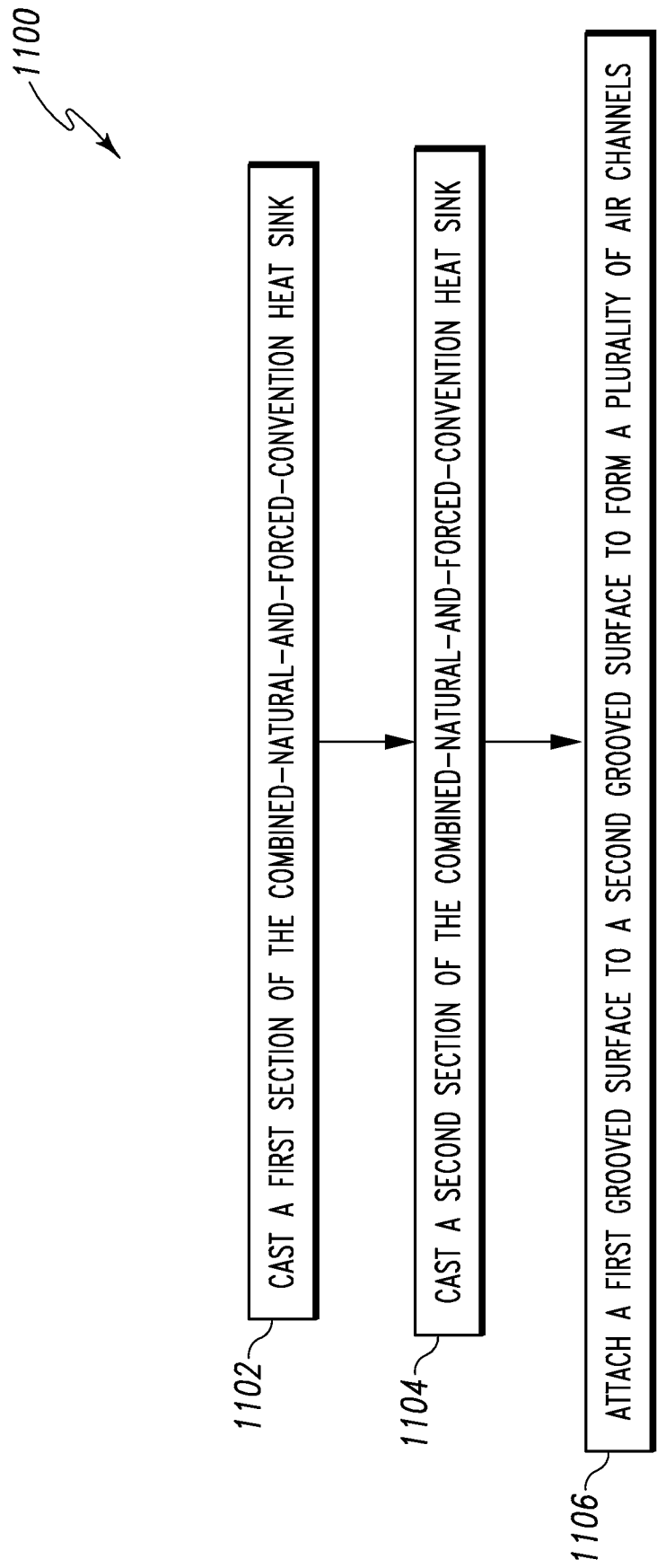

FIG. 11 is a flow diagram of one embodiment of a method to make a combined-natural-and-forced-convection heat sink.

Figure 12:
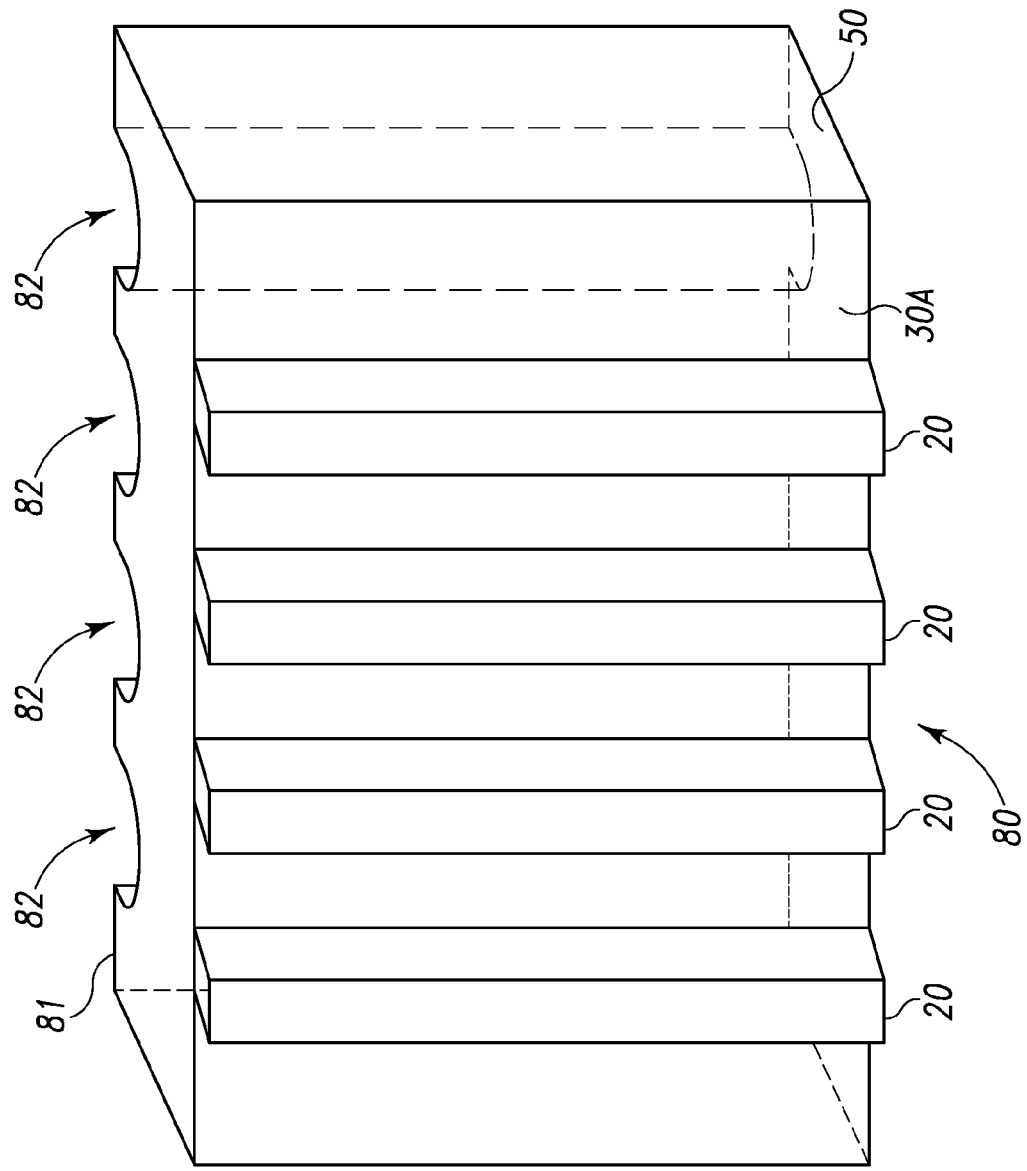

FIG. 12 is a sketch of a first section used to make a combined-natural-and-forced-convection heat sink.

Figure 13:
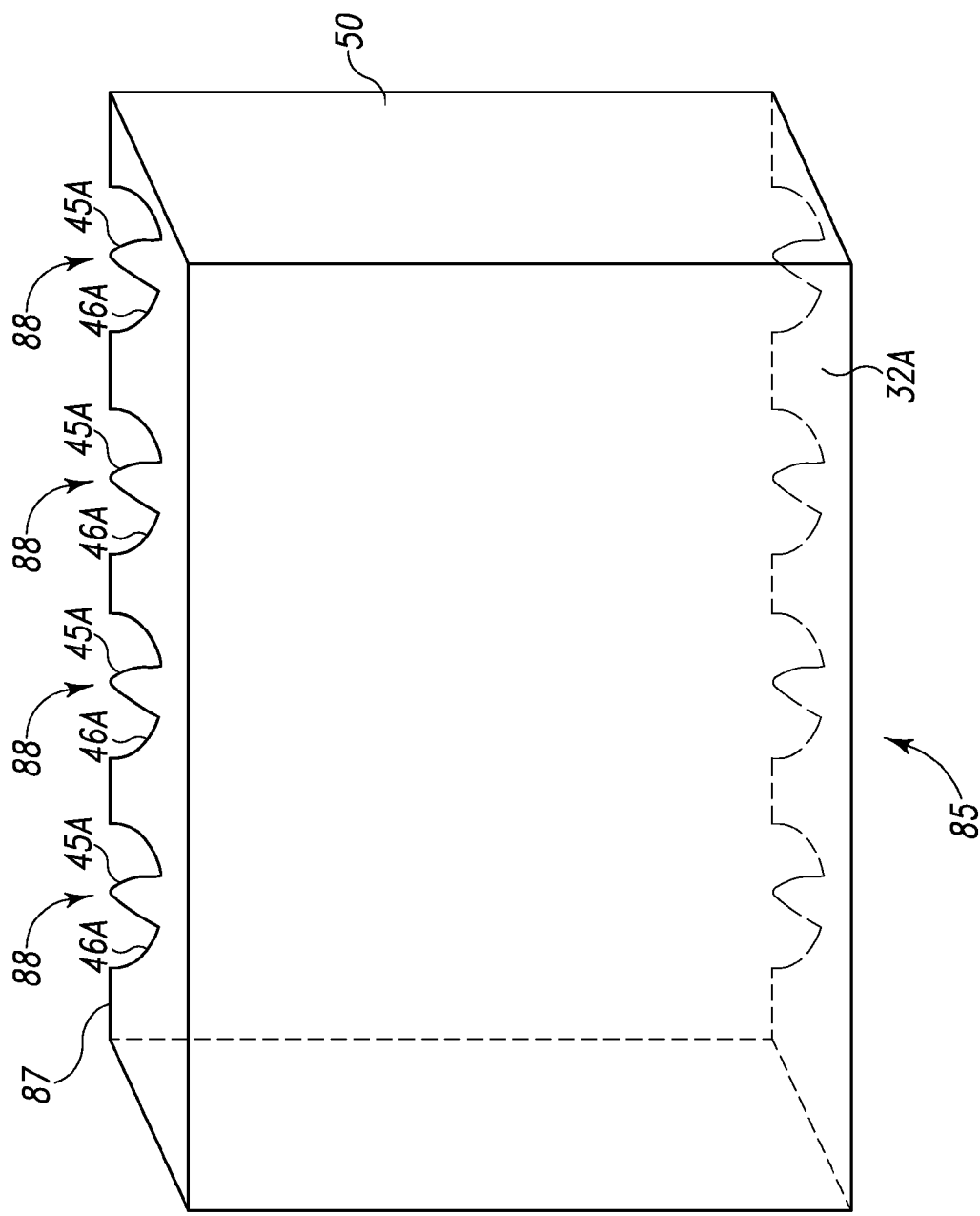

FIG. 13 is a sketch of a second section used to make a combined-natural-and-forced-convection heat sink.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

The combined-natural-and-forced-convection heat sink described herein utilizes two separate sets of channels. In one embodiment, there are external channels formed by protruding fins, which are capable of natural convection, positioned adjacent to internal air channels, which are capable of forced convection. The combined-natural-and-forced-convection heat sink system includes a fan, a temperature sensor, and a fan controller operably positioned to force an airflow through the air channels when the temperature at the temperature sensor exceeds a selected temperature threshold. In one implementation of this embodiment, a fan shroud is used to direct the airflow to an input end of the air channels. A heat-sink shroud is not required in the combined-natural-and-forced-convection heat sink system. This is advantageous, since the temperature threshold is reached at a lower ambient temperature when a heat-sink shroud is used due to the reduction in the ability of the natural-convection heat sink to convect heat in the presence of the heat-sink shroud.

Figure 1:
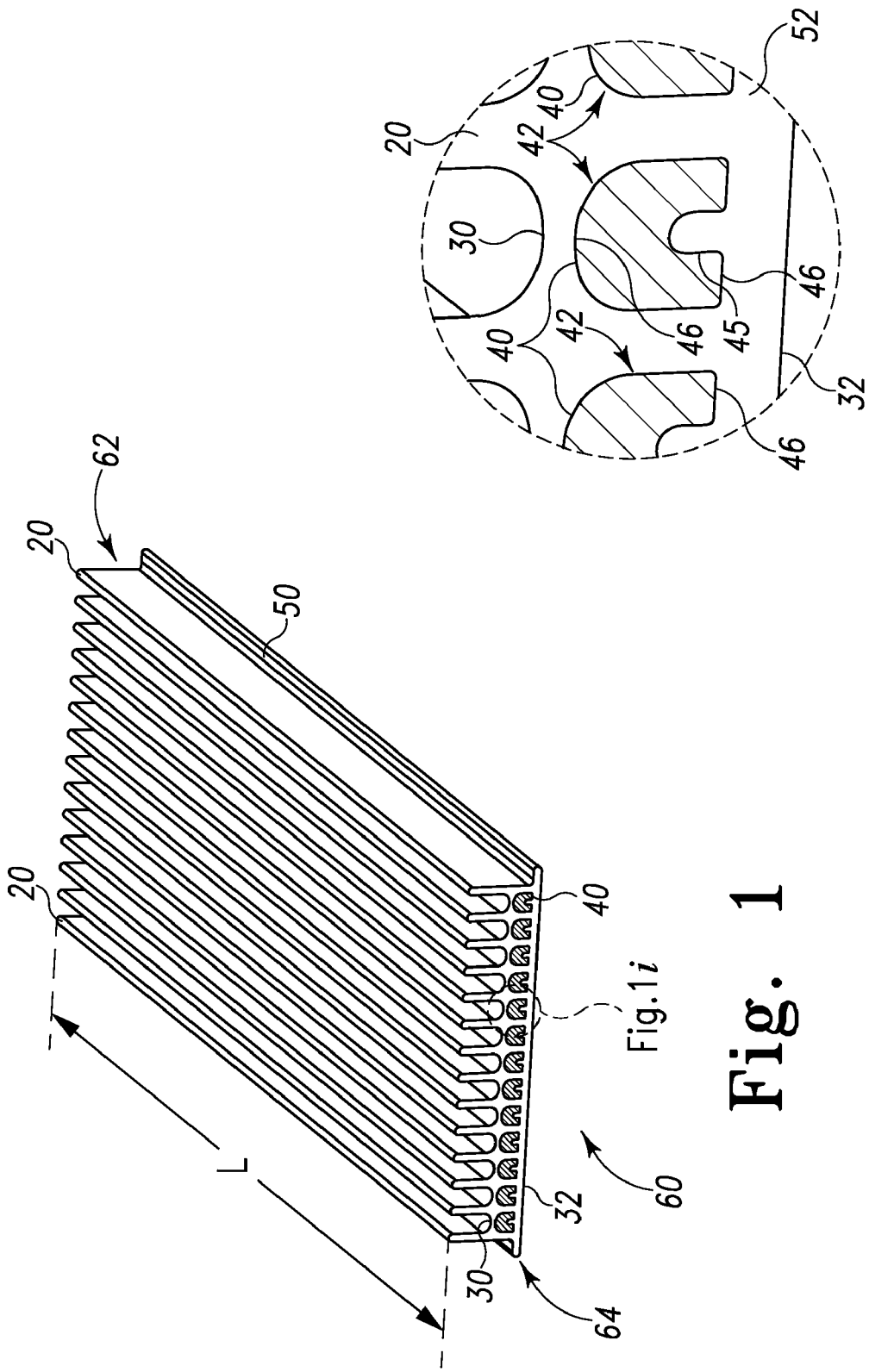

FIG. 1 is a sketch of one embodiment of a combined-natural-and-forced-convection heat sink 60. The combined-natural-and-forced-convection heat sink 60 includes a natural-convection heat sink represented generally by the numeral 62 and a forced-convection heat sink represented generally by the numeral 64. The natural-convection heat sink 62 includes a plurality of fins 20 that protrude from a first surface 30 of a conductive material 50. The forced-convection heat sink 64 includes a plurality of air channels 40 formed between the first surface 30 and an opposing second surface 32 of the conductive material 50. The fins 20 extend along a length L of the conductive material 50. In one implementation of this embodiment, the conductive material 50 is aluminum. In another implementation of this embodiment, the conductive material 50 is copper. In yet another implementation of this embodiment, the conductive material 50 is another metal.

FIG. 1$i$ is an enlarged view of an input end 42 of an air channel 40 in a forced-convection heat sink 64 of FIG. 1. The air channels 40 include air-channel fins 45 that protrude from a surface 46 of the air channel 40 into the air channel 40. The air-channel fins 45 extend along a length L of the air channel 40. The input ends 42 of the air channels 40 open on an input surface 52 of the conductive material 50.

Figure 2:
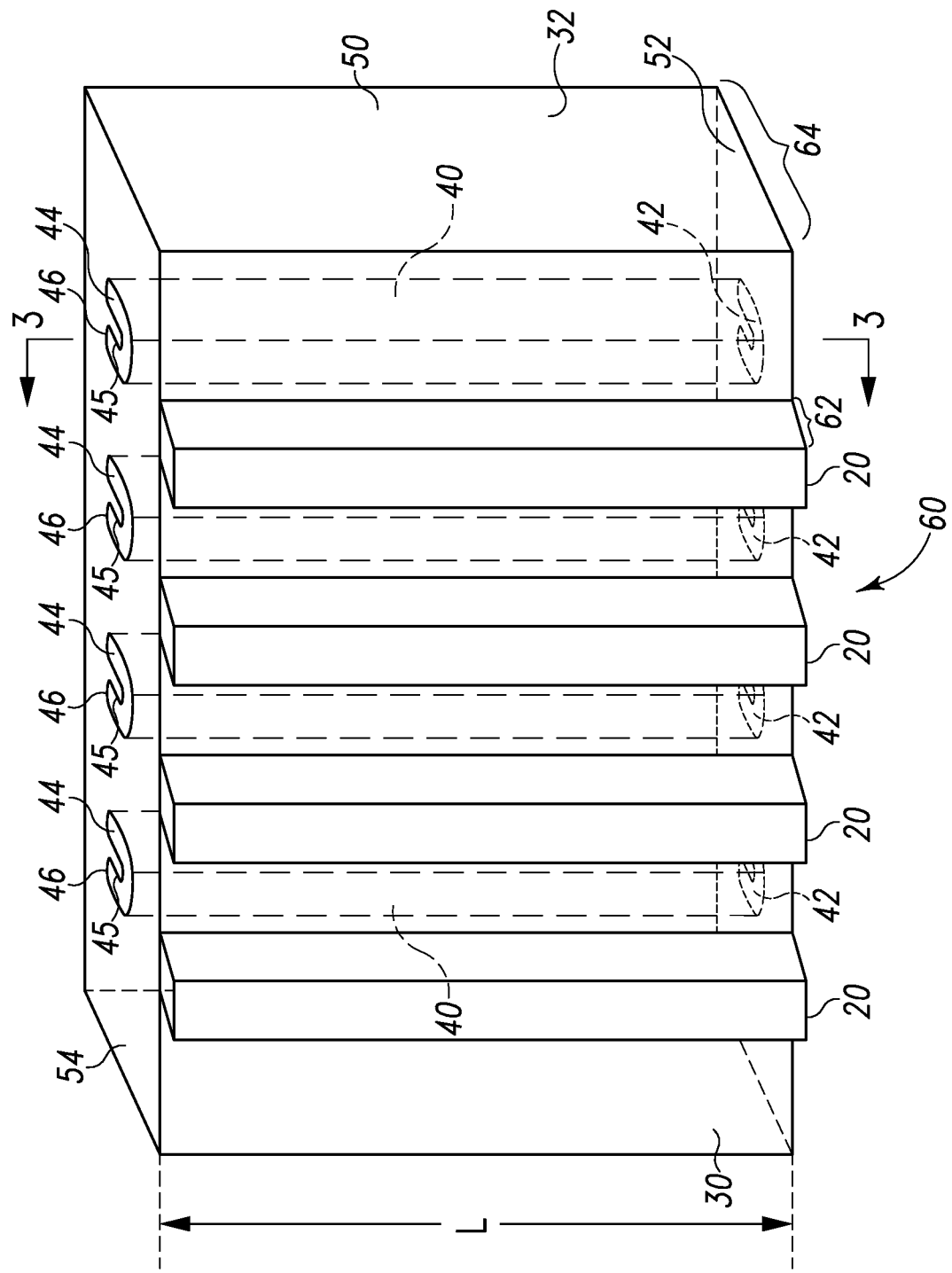
FIG. 2 is a sketch of one embodiment of a combined-natural-and-forced-convection heat sink.
Figure 3:
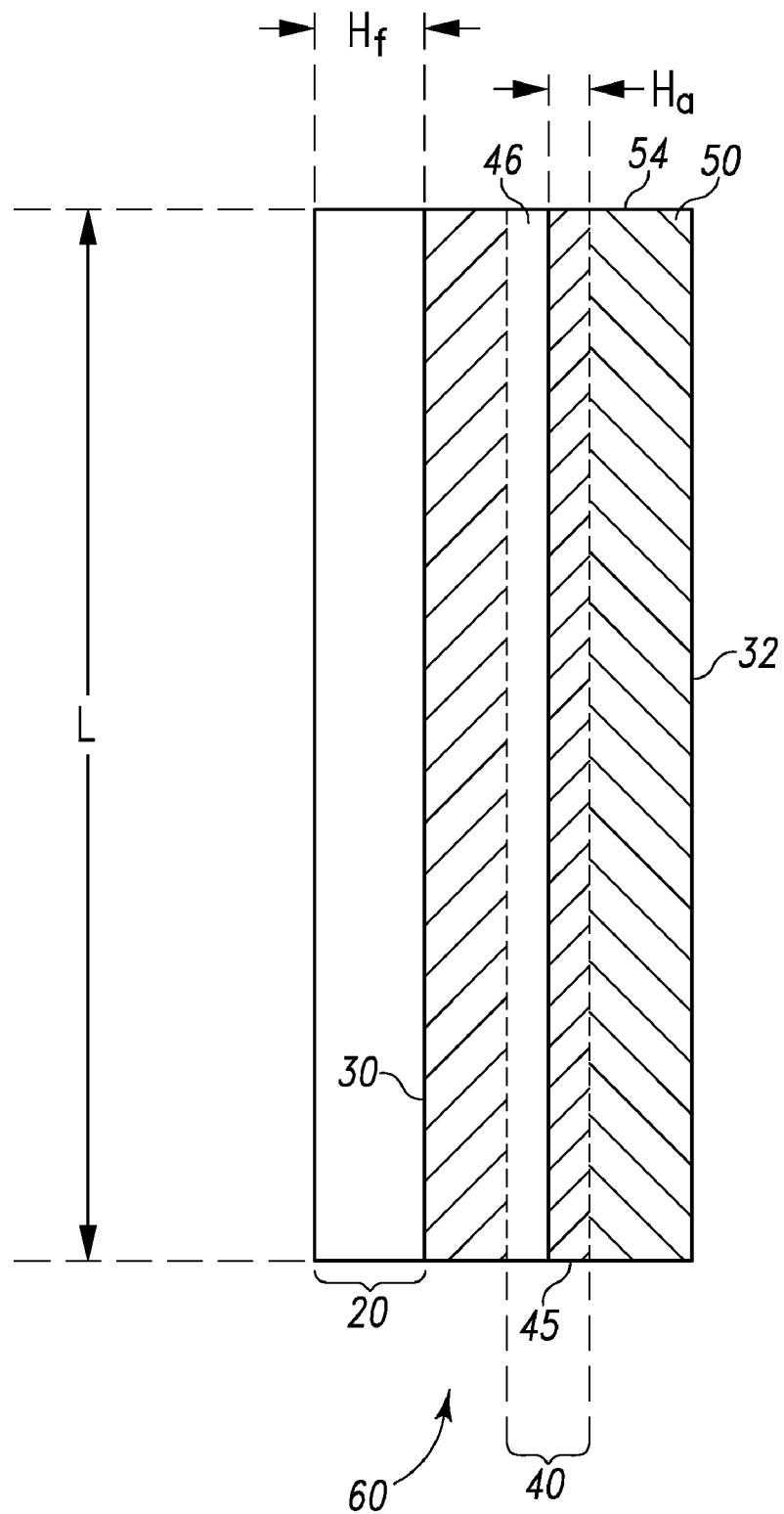
FIG. 3 is a cross-sectional side view of one embodiment of a combined-natural-and-forced-convection heat sink.

Each air channel 40 has an output end 44 opening on an output surface 54 of the conductive material 50 as shown in FIG. 2. FIG. 2 is a sketch of an alternate view of one embodiment of a combined-natural-and-forced-convection heat sink 60. The extent of the air channels 40 from the input ends 42 to the output ends 44 are indicated as dashed lines in FIG. 2. FIG. 3 is a cross-sectional side view of the combined-natural-and-forced-convection heat sink 60. The plane upon which the cross-section view of FIG. 3 is taken is indicated by section line 3-3' in FIG. 2. The surface 46 of the back of the air channel 40 is visible beyond the cross-section of the air-channel fin 45. The height of the fins 20 is $H_f$ and the height of the air-channel fins 45 is $H_a$.

Figure 4:
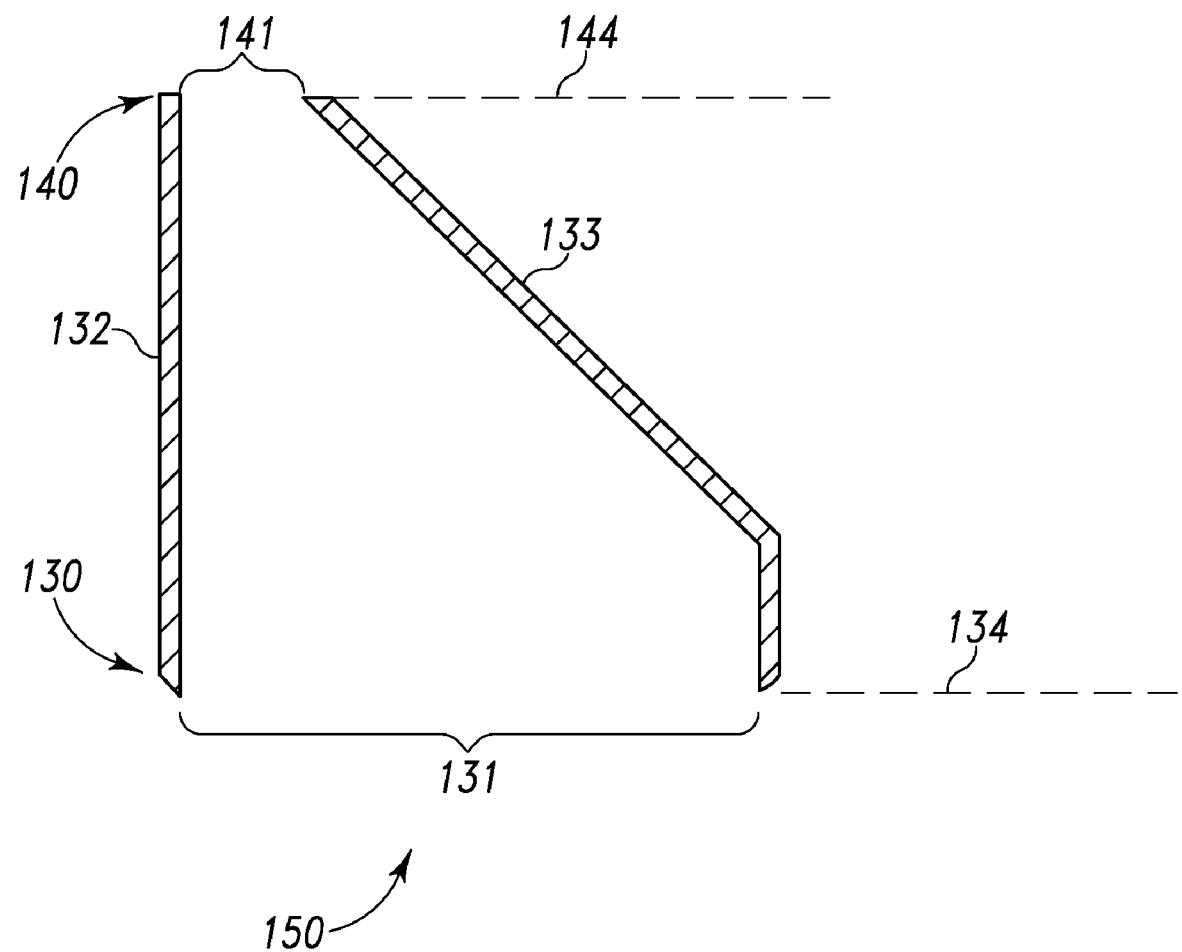
FIG. 4 is a sketch of one embodiment of a fan.

FIG. 4 is a sketch of one embodiment of a fan shroud 150. The fan shroud 150 comprises a first side 132 and a second side 133 that is non-parallel to the first side 132 and is useful for a natural-and-forced-convection heat sink. The fan shroud 150 has an open fan end 130 and an open heat-sink-interface end 140. The fan end 130 has a first open area 131 lying in a first plane shown in cross section as line 134. The heat-sink-interface end 140 has a second open area 141 lying in a second plane shown in cross section as line 144. The first open area 131 larger than the second open area 141.

Figure 5:
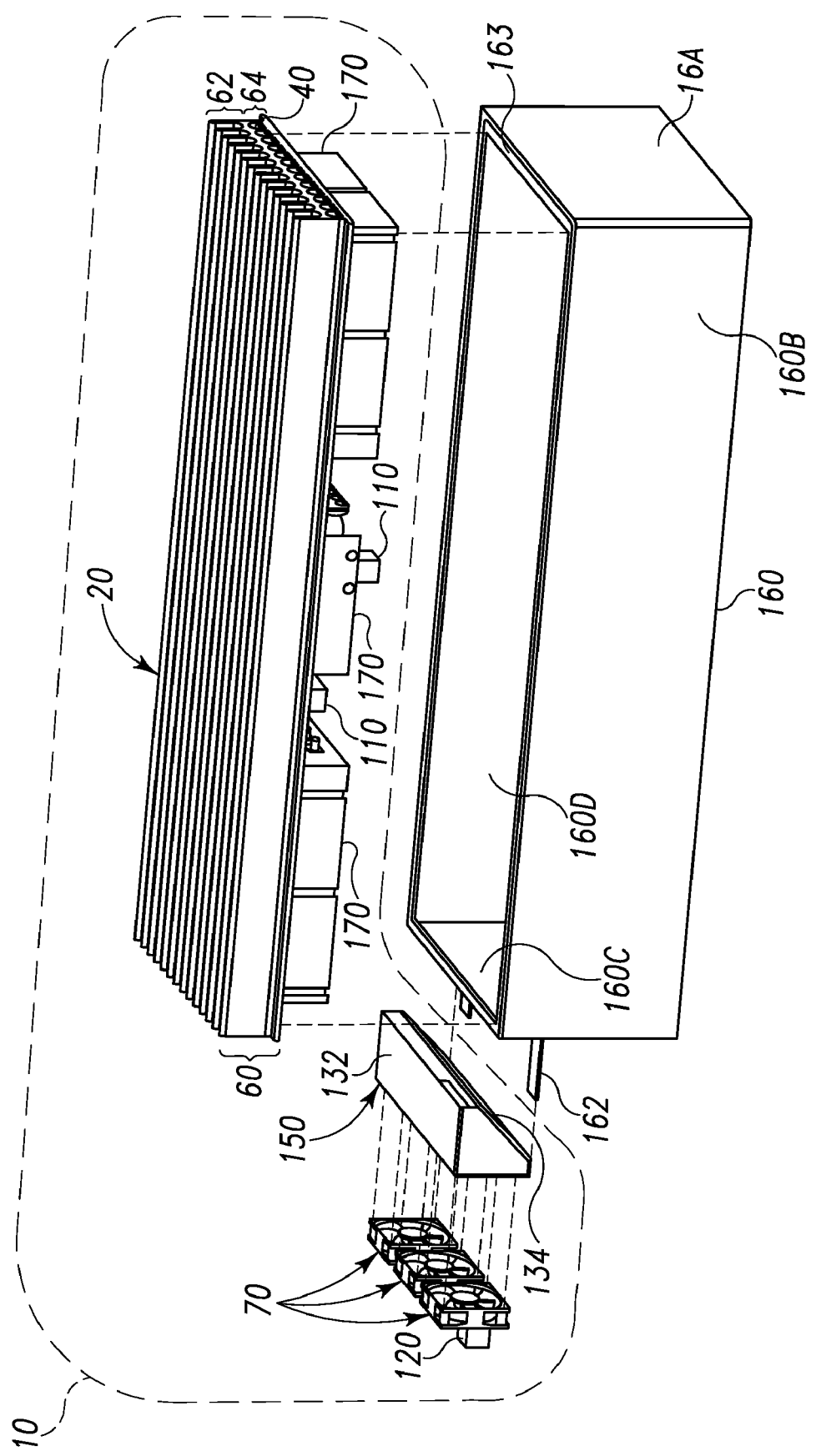
FIG. 5 is an exploded view of one embodiment of a housing and a combined-natural-and-forced-convection heat sink system with attached electronic components.

FIG. 5 is an exploded view of one embodiment of a housing 160 and a combined-natural-and-forced-convection heat sink system 10. The combined-natural-and-forced-convection heat sink system 10 includes the combined-natural-and-forced-convection heat sink 60, at least one fan 70, the fan shroud 150, the temperature sensor 110, and the fan controller 120. As shown in FIG. 5, at least one electronic component 170 and the temperature sensor 110 are attached to the second surface 32 (FIG. 3) of the conductive material 50 that forms the combined-natural-and-forced-convection heat sink 60. The housing 160 includes a rim surface 163 and a support 162. In one implementation of this embodiment, the rim surface 163 is the edge of four housing walls, 160A, 160B, 160C, and 160D. The combined-natural-and-forced-convection heat sink 60 removes heat from the electronic components 170 as described below with reference to method 800 of FIG. 8.

FIG. 6 is a view of one embodiment of a combined-natural-and-forced-convection heat sink system 10 with attached electronic components 170 enclosed in a housing 160. The components of the combined-natural-and-forced-convection heat sink system 10, shown in the exploded view in FIG. 5, are operably positioned as shown in FIG. 6. FIG. 6$i$ is an enlarged view of the fan shroud 150 operably positioned to direct air flow into the forced convection channels to remove heat from the electronic components 170 enclosed in the housing 160 of FIG. 6. The second surface 32 of the conductive material 50 is attached to the rim surface 163 so that the electronic components 170 are enclosed within the housing 160. The support 162 attaches the fan shroud 150 to the housing 160. The electronic components 170 generate heat when they operate. The heat is thermally conducted to the combined-natural-and-forced-convection heat sink 60 through the second surface 32 to the air-channel fins 45 and the fins 20 for dissipation.

The fan controller 120 is operable to turn on the fan 70 when the information indicative of the temperature is greater than the selected temperature threshold level. The selected temperature threshold varies according to electronic components 170 enclosed in the housing 160. When the temperature threshold is a relatively low temperature, the fans run more often and the ambient temperature inside the housing 160 is cooler. When the temperature threshold is a relatively high temperature, the electronic components 170 degrade at a faster rate when the ambient temperature inside the housing 160 is cooler, but the fan life increases due to its shorter run times.

As shown in FIGS. 6 and 6$i$, a fan 70 is inserted in the open fan end 130 and the heat-sink-interface end 140 is operably positioned adjacent to the input surface 52 of the conductive material 50. A temperature sensor 110 (FIG. 6) position on the substantially flat surface 32, or above the electronics if internal ambient air temperature is the desired controlling factor, is communicatively coupled via a wire 111 (FIG. 6) to the fan controller 120. In this manner, the fan controller 120 is communicatively coupled to receive information indicative of temperature from the temperature sensor 110. In one implementation of this embodiment, the fan controller 120 is communicatively coupled to wirelessly receive the information indicative of temperature from the temperature sensor 110. The fan controller 120 is operable to turn on the fan 70 when the information indicative of the temperature is greater than a selected temperature threshold level.

As shown in FIG. 6i, the operation of the fan 70 pulls the ambient air 200 across the first open area 131 in the first plane 134 to generate airflow 204 in the fan shroud 150. The first side 132 and the second side 133 direct the airflow 204 from the larger first open area 131 to the smaller second open area 141 so that the volumetric airflow is higher at the second open area 141. The directed airflow 204 is output from the fan shroud 150 across the second open area 141 in the second plane 144 and into the input ends 42 of the plurality of air channels 40 as airflow 205. The fan shroud 150 is positioned so that the flow of ambient air 200 across the fins 20 is unobstructed. In this manner, the natural-convection heat sink 62 is fully operational while the forced-convection heat sink 64 is also operational.

As shown in FIGS. 3 and 5, the plurality of fins 20 and the air-channel fins 45 are straight and parallel to each other and have the same height $H_f$ and $H_a$, respectively (FIG. 3). In one implementation of this embodiment, at least a portion of the electronic components 170 include high temperature components, such as electronic component 170A (FIG. 6) that are attached to a higher-heat region 36 of the second surface 32 of the conductive material 50.

FIG. 7 is an exemplary configuration of combined-natural-and-forced-convection heat sink 61 in which the spacing between the fins 20 and the air-channel fins 45 increases when the fins 20 and the air-channel fins 45 are adjacent to the higher-heat region 36. The combined-natural-and-forced-convection heat sink 61 removes more heat from the higher-heat region 36 of the second surface 32 of the conductive material 50 than from the lower-heat region 37 of the second surface 32. A heat sink with this shape requires the use of a casting technology such as sand casting or die casting, or machining, two separate halves to create this geometry.

As shown in FIG. 7, the plurality of fins 21 and the air-channel fins 47 of the combined-natural-and-forced-convection heat sink 61 are not all straight and are not parallel to each other for their complete length L. The plurality of fins 21 that protrude from the first surface 30 of the conductive material 50 form a natural-convection heat sink 66. The plurality of air channels 48 forms a forced-convection heat sink 67. Only the complete length of the right-most air channel 48 is shown in FIG. 7 for clarity of the drawing. The output ends 44 opening on the output surface 54 of the conductive material are shown for the plurality of air channels 48 to indicate the positions of the air channels 48 in the forced-convection heat sink 67. In one implementation of this embodiment, each air channel 48 has a shape the runs approximately parallel to the closest fin 21. In another implementation of this embodiment, the air channels 48 are straight and not parallel to the fins 21.

The combined-natural-and-forced-convection heat sink 61 includes the natural-convection heat sink 66 and the forced-convection heat sink 67.

The spacing between the fins 21 and the air-channel fins 47 in the lower-heat region 37 is $S_C$ and the spacing between the fins 21 and the air channels 48 in the higher-heat region 36 is $S_H$. The spacing $S_H$ is greater than the spacing $S_C$. The fins 21 and the air channels 48 in the higher-heat region 36 are configured for higher heat dissipation than in the lower-heat region 37 since a larger volumetric airflow is provided by the fins 21 and the air channels 48 in the higher-heat region 36. The fins 21 are not parallel in the transition region 38 where the spacing between neighboring fins 20 is being changed from $S_C$ to $S_H$. Likewise, the air-channel fins 47 are not parallel in the transition region 38 where the spacing between neighboring air-channel fins 47 is being changed from $S_C$ to $S_H$.

The length of the fins 21 and the air channels 48 in the higher-heat region 36 is $L_{HH}$. The length of the fins 21 and the air channels 48 in the lower-heat region 37 is $L_{LH}$. The length of the fins 21 and the air channels 48 in the transition region 38 is slightly greater than $L_T$. The lengths $L_{HH}$, $L_{LH}$, and $L_T$ equal the length L.

In one implementation of this embodiment, the fins 21 that protrude from the first surface 30 to form the natural-convection heat sink 66 have a height within the higher-heat region 36 that is greater than the height in the lower-heat region 37. In an exemplary embodiment, the height of the fins 21 in the lower-heat region 37 is $H_f$ (FIG. 3) while the height of the fins 21 in the higher-heat region 36 is greater than $H_f$. In such an embodiment, the fins 21 of the natural-convection heat sink 66 in the higher-heat region 36 dissipate more heat than in the lower-heat region 37 since a larger volumetric airflow is provided by the higher fins 21 in the higher-heat region 36.

In another implementation of this embodiment, the air-channel fins 47 that protrude from the surface 46 of the air channel 48 of the forced-convection heat sink 67 have a height within the higher-heat region 36 that is greater than height within the lower-heat region 37. In an exemplary embodiment, the height of the air-channel fins 47 in the lower-heat region 37 is $H_a$ (FIG. 3) while the height of the air-channel fins 47 in the higher-heat region 36 is greater than $H_a$. In such an embodiment, the air channels 48 in the higher-heat region 36 dissipate more heat than in the lower-heat region 37 since more heat is dissipated by the larger air-channel fins 47 in the higher-heat region 36. In yet another implementation of this embodiment, the diameter of the air channels 48 is larger in the higher-heat region 36 than in the lower-heat region 37. In such an embodiment, the air channels 48 in the higher-heat region 36 dissipate more heat than in the lower-heat region 37 since a larger volumetric airflow is provided by the larger diameter air channels 48 in the higher-heat region 36. In yet another implementation of this embodiment, both the fins 21 and the air-channel fins 47 are higher and further separated in the higher-heat region 36 than in the lower-heat region 37 and the diameter of the air channels 48 is larger in the higher-heat region 36 than in the lower-heat region 37.

FIG. 8 is a flow diagram of one embodiment of a method 800 to remove heat from electronic components positioned in a housing. Method 800 is described with reference to the exemplary combined-natural-and-forced-convection heat sink of FIGS. 6 and 6i although the method 800 is applicable to other combined-natural-and-forced-convection heat sinks, such as combined-natural-and-forced-convection heat sink 61 shown in FIG. 7. At step 802, a natural-convection heat sink 62 of a combined-natural-and-forced-convection heat sink 60 is used to remove heat from the electronic components 170 in the housing 160. The fans 70 in the combined-natural-and-forced-convection heat sink system 10 are not turned on at this point in time. At step 804, the temperature sensor 110 monitors the temperature inside the housing 160 to determine if the temperature in the enclosed housing 180 is greater than the temperature threshold. The temperature sensor 110 is enclosed in the housing 160 with the heat producing electronic equipment 170. As long as the temperature sensor 110 is sensing a temperature that is below the threshold temperature, the flow is maintained between steps 802 and 804. If the temperature sensor 110 senses that the temperature has exceeded the threshold temperature, the flow proceeds to step 806.

At step 806, the fan controller 120 turns on at least one fan 70 positioned adjacent to the housing 160 to generate airflow 204 in the forced convection heat sink 64. The temperature sensor 110 sends information indicative that the temperature inside the housing 160 exceeds a temperature threshold to trigger the fan controller 120 to turn on the at least one fan 70. In one implementation of this embodiment, more than one temperature threshold is used to control a plurality of fans. In this case, when the first temperature threshold is exceeded at the temperature sensor, a first fan of the plurality of fans is turned on and when the second temperature threshold is exceeded at the temperature sensor, a second fan of the plurality of fans is turned on, and so on until all the fans are turned on.

At step 808, the fan shroud 150 directs the airflow 204 from the at least one fan 70 into an input end 42 of the plurality of air channels 40 that form the forced-convection heat sink 64 of the combined-natural-and-forced-convection heat sink 60. The fans 70 are positioned in the open fan end 130 of the fan shroud 150 and the heat-sink-interface end 140 of the fan shroud 150 is positioned at the input end 42 of the plurality of air channels 40. The fan shroud 150 is attached to an end of the housing 160 by support 162 in order to maintain the position the heat-sink-interface end 140 at the input end 42 of the plurality of air channels 40.

At step 810, the forced-convection heat sink and the natural-convection heat sink 62 of the combined-natural-and-forced-convection heat sink 60 are both used to remove heat from the components in the housing 160 responsive to turning on the fans 70. At step 812, the temperature sensor 110 continues to monitor the temperature while the fans are on to determine if the temperature in the enclosed housing 180 is still greater than the temperature threshold. The fans 70 stay on while the temperature remains above the temperature threshold, and the flow maintained between steps 808, 810 and 812.

When the temperature is less than the threshold temperature, the flow proceeds to step 814. At step 814, the fan controller turns off the at least one fan 70 positioned adjacent to the housing 160 when the temperature inside the housing 160 drops to a level that is less than the temperature threshold. The temperature sensor 110 sends information indicative that the temperature inside the housing 160 is less than the temperature threshold to trigger the fan controller 120 to turn off the fans 70. The flow proceeds back to step 802 and the natural-convection heat sink 62 of a combined-natural-and-forced-convection heat sink 60 is used to remove heat from the electronic components 170 in the housing 160 responsive to turning off the fans 70.

FIG. 9 is a flow diagram of one embodiment of a method 900 to make a combined-natural-and-forced-convection heat sink. At step 902, a conductive material 50 is extruded from a combined-natural-and-forced-convection-heat-sink fixture. The combined-natural-and-forced-convection-heat-sink fixture is shaped so that malleable conductive material pushed through the fixture emerges from the fixture with the shape of the combined-natural-and-forced-convection heat sink 60 in FIG. 1. In one implementation of this embodiment, the combined-natural-and-forced-convection-heat-sink fixture comprises fin structures to form the fins in the natural-convection heat sink and structures to form air channels 40 include air-channel fins 45 that protrude from a surface 46 of the air channel 40 into the air channel 40 in the forced-convection heat sink. The combined-natural-and-forced-convection-heat-sink fixture is a closed profile extrusion die as known in the art. At step 904, the extruded material cooled. At step 906, the cooled material is cut into desired lengths to form the combined-natural-and-forced-convection heat sink, such as combined-natural-and-forced-convection heat sink 60 shown in FIG. 6. The combined-natural-and-forced-convection heat sink is now fabricated and is ready to be prepared for use as described below with reference to method 1000 of FIG. 10.

FIG. 10 is a flow diagram of one embodiment of a method 1000 to use a combined-natural-and-forced-convection heat sink 60. Method 1000 is described with reference to the exemplary combined-natural-and-forced-convection heat sink of FIGS. 6 and 6i although method 1000 is applicable to other combined-natural-and-forced-convection heat sinks, such as combined-natural-and-forced-convection heat sink 61 shown in FIG. 7.

At step 1002, electronic components 170 are attached to a substantially flat surface of the combined-natural-and-forced-convection heat sink 60. In one implementation of this embodiment, the second surface 32 (FIG. 6) is the substantially flat surface. In another implementation of this embodiment, the second surface 32 includes a plurality substantially flat steps or terraces. In this latter case, each terrace is a substantially flat surface so that the substantially flat surface, such as second surface 32, includes a plurality of substantially flat surfaces. In one implementation of this embodiment, the surfaces that comprise the substantially flat surface are coplanar to each other. The terraces are used to simplify integration and/or relative positioning of any electronic components that are attached to the second surface 32.

At step 1004, a portion of the substantially flat surface 32 is attached to a rim surface 163 of a housing 160. The electronic components 170 are enclosed in the housing 160 after the peripheral portion of the flat surface 32 is attached to the rim surface 163. At step 1006, an open heat-sink-interface end 140 of a fan shroud 150 is attached to the housing 160. The open heat-sink-interface end 140 is operably positioned adjacent to the input surface of the conductive material 50

At step 1008, at least one fan 70 is inserted into an open fan end of the fan shroud 150. When the at least one fan is operating, the operable position of the open heat-sink-interface end 140 permits a flow of air into the air channels 40 in the conductive material 50. At step 1010, a temperature sensor 110 is attached to one of the substantially flat surfaces 32 or to the electronic components 170 that are attached to the substantially flat surface 32. At step 1012, the temperature sensor 110 is communicatively coupled to a fan controller 120. The fan controller 120 is operable to control the fan or fans 70.

FIG. 11 is a flow diagram of one embodiment of a method 1100 to make a combined-natural-and-forced-convection heat sink. The method 1100 is described with reference to FIGS. 12 and 13. FIG. 12 is a sketch of a first section 80 used to make a combined-natural-and-forced-convection heat sink. FIG. 13 is a sketch of a second section 85 used to make a combined-natural-and-forced-convection heat sink.

At step 1102, a first section 80 (FIG. 12) of the combined-natural-and-forced-convection heat sink 60 is cast. The first section 80 is formed from a conductive material 50, such as aluminum or copper. The first section 80 has a plurality of fins 20 on a first surface 30A and a plurality of semi-cylindrical grooves 82 on a first grooved surface 81. The grooved surface 81 opposes the first surface 30A. At step 1104, a second section 85 (FIG. 13) of the combined-natural-and-forcedconvection heat sink 60 is cast. The first section 80 is formed from the conductive material 50. The second section 85 has a second grooved surface 87 that includes a ridged plurality of semi-cylindrical grooves 88. Each semi-cylindrical groove 88 has a fin 45A protruding from the surface 46A of the semi-cylindrical grooves 88. The second grooved surface 87 opposes a fourth surface 32A.

At step 1106, the first grooved surface 81 is attached to the second grooved surface 87 so that the plurality of semi-cylindrical grooves 82 on the first grooved surface 81 and the ridged plurality of semi-cylindrical grooves 88 on the second grooved surface 87 form a plurality of air channels 40, as described above with reference to FIGS. 1, 1i and 2. When the first section 80 is attached to the second section 85, the plurality of semi-cylindrical grooves 82 and the plurality of semi-cylindrical grooves 82 form air-channels 40. The fin 45A is the air-channel fin 45 of the air-channels 40. After assembly of the first surface 30A is the first surface 30 and the fourth surface 32A is the second surface 32 (FIG. 1). In one implementation of this embodiment, the first grooved surface 81 is welded to the second grooved surface 87. In another implementation of this embodiment, the first grooved surface 81 is glued to the second grooved surface 87. Other methods of making the combined-natural-and-forced-convection heat sink are possible.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A combined-natural-and-forced-convection heat sink system comprising:
   a plurality of fins protruding from a first surface of a conductive material, the plurality of fins forming a natural-convection heat sink;
   a plurality of air channels formed between the first surface and an opposing second surface of the conductive material, each of the plurality of air channels being positioned below the first surface of the conductive material between two adjacent fins, each air channel having an input end opening on an input surface of the conductive material, and each air channel having an output end opening on an output surface of the conductive material, the plurality of air channels forming a forced-convection heat sink, wherein the natural-convection heat sink and the forced-convection heat sink form a combined-natural-and-forced-convection heat sink; and
   at least one fan configured to generate an air flow through the air channels when at least one fan is operating.

2. The system of claim 1, wherein the air channels include air-channel fins protruding from a surface of the air channel into the air channel and along a length of the air channel.

3. The system of claim 2, wherein each of the plurality of fins protruding from the first surface extends along a length of the first surface, and wherein each air-channel fin in a respective one of the plurality of air channels is parallel to a respective one of the plurality of fins protruding from the first surface.

4. The system of claim 1, wherein each of the plurality of fins protruding from the first surface extends along a length of the first surface, and wherein the each of the plurality of air channels is parallel to a respective one of the plurality of fins.

5. The system of claim 1, further comprising:
   a temperature sensor; and
   a fan controller communicatively coupled to receive information indicative of temperature from the temperature sensor, the fan controller operable to turn on the at least one fan when the information indicative of the temperature is greater than a temperature threshold level.

6. The system of claim 1, further comprising:
   a fan shroud having an open fan end in which the at least one fan is positioned and an open heat-sink-interface end that is operably positioned adjacent to the input surface of the conductive material.

7. The system of claim 6, the fan end having a first open area laying in a first plane and the heat-sink-interface end having a second open area laying in a second plane, the first open area being larger than the second open area, wherein the fan shroud further comprises:
   a first side; and
   a second side that is non-parallel to the first side, wherein the operation of the at least one fan generates an airflow that passes through the first open area in the first plane and is directed between the first side and the second side, wherein the directed airflow is output across the second open area in the second plane and into the input end of the plurality of air channels.

8. The system of claim 6, the system further comprising:
   at least one temperature sensor attached to at least one of the second surface of the conductive material and at least one electronic component attached to the second surface; and
   a fan controller communicatively coupled to receive information indicative of temperature from the at least one temperature sensor, wherein the fan controller turns on the fan positioned at the fan end of the fan shroud when the information indicative of the temperature is greater than a threshold level, wherein the force convection heat sink is operable to reduce the temperature of the electronic components.

9. The system of claim 8, further comprising:
   a support that attaches the fan shroud to a housing, the housing enclosing the at least one electronic component.

10. The system of claim 8, wherein at least a portion of the electronic components include high temperature components operably attached to a higher-heat region of the second surface of the conductive material, and wherein the plurality of fins protruding from the first surface and the plurality of air channels are configured for higher heat dissipation at the higher-heat region of the second surface of the conductive material.

11. The system of claim 1, wherein at least one electronic component is attached to the second surface of the conductive material, wherein the at least one electronic component is positioned within a housing when the second surface is attached to a rim surface of the housing in a manner that encloses electronic components in the housing, and wherein the combined-natural-and-forced-convection heat sink removes heat from the at least one electronic component.

12. The system of claim 1, wherein each air channel positioned below the first surface of the conductive material between adjacent fins runs approximately parallel to the adjacent fins.

* * * * *